(12) United States Patent
Shirasaki et al.

(10) Patent No.: US 8,221,944 B2
(45) Date of Patent: Jul. 17, 2012

(54) PELLICLE FRAME AND LITHOGRAPHIC PELLICLE

(75) Inventors: Toru Shirasaki, Gunma (JP); Kishore Chakravorty, Santa Clara, CA (US); David Mushell, Santa Clara, CA (US); Grace Ng, Santa Clara, CA (US)

(73) Assignees: Shin-Etsu Chemical Co., Ltd., Tokyo (JP); Intel Corporation, Santa Clara, CA (US)

( * ) Notice: Subject to any disclaimer, the term of this patent is extended or adjusted under 35 U.S.C. 154(b) by 211 days.

(21) Appl. No.: 12/819,527

(22) Filed: Jun. 21, 2010

(65) Prior Publication Data

US 2010/0330466 A1 Dec. 30, 2010

(30) Foreign Application Priority Data

Jun. 24, 2009 (JP) .................................. 2009-149776

(51) Int. Cl.
*G03F 1/62* (2012.01)
*G03F 1/64* (2012.01)

(52) U.S. Cl. .......................................................... 430/5
(58) Field of Classification Search .......... 430/5; 428/14
See application file for complete search history.

(56) References Cited

FOREIGN PATENT DOCUMENTS

| | | |
|---|---|---|
| JP | 9-68793 | 3/1997 |
| JP | 2009-25562 A1 | 2/2009 |

*Primary Examiner* — Stephen Rosasco
(74) *Attorney, Agent, or Firm* — Kratz, Quintos & Hanson, LLP

(57) ABSTRACT

A pellicle frame is provided that comprises a pellicle frame bar having a quadrilateral cross-section, wherein an upper edge and a lower edge of a basic quadrilateral forming said cross-section are parallel to each other and each of side edges of the basic quadrilateral has one quadrilateral recess. There is also provided a lithographic pellicle that includes a pellicle film stretched over one end face of the pellicle frame via a pellicle film adhesive, and that includes an exposure master plate adhesive on the other end face.

12 Claims, 3 Drawing Sheets

PELLICLE FRAME AND LITHOGRAPHIC PELLICLE

BACKGROUND OF THE INVENTION

1. Field of the Invention

The present invention relates to a pellicle frame and a lithographic pellicle used as a debris shield for a lithography mask when producing a liquid crystal display panel or a semiconductor device such as an LSI or a ULSI.

2. Description of the Related Art

In the production of a semiconductor such as an LSI or a ULSI or the production of a liquid crystal display panel, a pattern is formed by irradiating a semiconductor wafer or a liquid crystal master plate with light; if debris is attached to an exposure master plate, since the debris absorbs the light or refracts the light, there are problems that the replicated pattern is deformed, the edges become rough, or the background is stained black, thus impairing the dimensions, quality, appearance, etc. The 'exposure master plate' referred to in the present invention is a general term for lithography masks (also called simply 'masks') and reticles. The explanation below is given for a mask as an example.

These operations are usually carried out in a clean room, but even within a clean room it is difficult to always keep the exposure master plate clean, and a method is therefore employed in which a pellicle film that allows exposure light to easily pass through is affixed to the surface of the exposure master plate to act as a debris shield.

The pellicle is basically constituted of a pellicle frame and a pellicle film stretched over the frame. The pellicle film is formed from nitrocellulose, cellulose acetate, a fluorine-based polymer, etc., which allows exposure light (g rays, i rays, 248 nm, 193 nm, etc.) to easily pass through. The pellicle film is adhered by coating the upper end part of the pellicle frame with a good solvent for the pellicle film and air-drying or by means of an adhesive such as an acrylic resin, an epoxy resin, or a fluorine resin. Furthermore, in order to mount an exposure master plate, a lower end part of the pellicle frame is provided with a pressure-sensitive adhesion layer made of a polybutene resin, a polyvinyl acetate resin, an acrylic resin, a silicon resin, etc. and a reticle pressure-sensitive adhesive protecting liner for the purpose of protecting the pressure-sensitive adhesive layer.

The pellicle is installed so as to surround a pattern region formed on the surface of the exposure master plate. Since the pellicle is provided in order to prevent debris from becoming attached to the exposure master plate, this pattern region and a pellicle outer part are separated so that dust from the pellicle outer part does not become attached to the pattern face.

In recent years, the LSI design rule has shrunk to sub-quarter micron, and accompanying this the wavelength of the exposure light source is being shortened, that is, instead of g rays (436 nm) and i rays (365 nm) from the hitherto predominant mercury lamp, a KrF excimer laser (248 nm), an ArF excimer laser (193 nm), etc. are being used. As shrinkage advances, the flatness required for the mask and silicon wafer becomes more strict.

A pellicle is affixed to a mask in order to shield the pattern from debris after the mask is completed. When a pellicle is affixed to the mask, the mask flatness can sometimes change. When the mask flatness is degraded, as described above there is the possibility that problems such as defocusing will occur. Furthermore, when the flatness changes, the pattern shape drawn on the mask changes, and this brings about the difficulty that problems occur with the precision of superimposition of the mask.

There are several factors involved in the change in mask flatness due to a pellicle being affixed, but it has been found that the largest factor is the flatness of the pellicle frame.

In order to prevent deformation of a mask due to deformation of a pellicle frame, JP-A-2009-25562 (JP-A denotes a Japanese unexamined patent application publication) discloses reducing the cross-sectional area of the pellicle frame to 6 mm$^2$ or less or using a material having a Young's modulus of 50 GPa or less in the pellicle frame.

Many pellicle frames have a rectangular cross-sectional shape, and JP-A-9-68793 discloses a pellicle frame for which the cross-section has a shape in which an upper end side of an inner peripheral face projects further inward than a lower end side.

BRIEF SUMMARY OF THE INVENTION

In recent years, with regard to the flatness required for a mask, from a flatness of 2 μm on the pattern face the requirement is gradually becoming more strict, and for the 65 nm node process and beyond, 0.5 μm or less and preferably 0.25 μm or less is now required.

In general, the flatness of a pellicle frame is in the order of 20 to 80 μm, but if a pellicle employing a pellicle frame having poorer flatness than a mask is affixed to the mask, the shape of the frame is transferred to the mask, thus causing deformation in the mask. When affixing, the pellicle is pressed against the mask with a large force of about 200 to 400 N (20 to 40 kgw). Since the flatness of the mask surface is better than the flatness of the pellicle frame, when pressing of the pellicle against the mask is completed, the pellicle frame attempts to return to its original shape, and the pellicle frame thereby causes the mask to deform.

When the mask is deformed, the mask flatness can sometimes be degraded, and in this case the problem of defocusing within an exposure device occurs. On the other hand, deformation of the mask can sometimes improve the flatness, but even in this case a pattern formed on the mask surface is distorted, and as a result the problem that a pattern image replicated on a wafer by exposure being distorted occurs. Since this distortion of the pattern also occurs when the mask flatness is degraded, when the mask ends up being deformed by affixing the pellicle, the problem of the pattern image being distorted always occurs.

It is a first object of the present invention to provide a pellicle frame that can suppress deformation of an exposure master plate due to deformation of the pellicle frame even if a pellicle is affixed to the exposure master plate. It is a second object of the present invention to provide a lithographic pellicle having such a pellicle frame.

The above-mentioned objects of the present invention have been accomplished by means (1) and (12) below. They are described together with (2) to (11), which are preferred embodiments.

(1) A pellicle frame comprising a pellicle frame bar having a quadrilateral cross-section, wherein an upper edge and a lower edge of a basic quadrilateral forming said cross-section are parallel to each other and each of side edges of the basic quadrilateral has one quadrilateral recess.

(2) The pellicle frame according to (1) above, wherein the basic quadrilateral is a rectangle, and at least one of the recesses is a rectangle having an edge parallel to the upper edge of the basic quadrilateral.

(3) The pellicle frame according to (1), wherein the basic quadrilateral is a rectangle, and at least one of the recesses is a trapezoid having an upper edge parallel to the upper edge of the basic quadrilateral.

(4) The pellicle frame according to (1), wherein the basic quadrilateral is a rectangle, and at least one of the recesses is a trapezoid having an upper edge and a lower edge of the trapezoid perpendicular to the upper edge of the basic quadrilateral.
(5) The pellicle frame according to (1), wherein the basic quadrilateral is a trapezoid, and at least one of the recesses is a trapezoid having an upper edge parallel to the upper edge of the basic quadrilateral.
(6) The pellicle frame according to any one of (1) to (5), wherein the basic quadrilateral has a cross-sectional area of at least 4 mm$^2$ but no greater than 20 mm$^2$.
(7) The pellicle frame according to any one of (1) to (6), wherein the pellicle frame bar has a cross-sectional area of at least 1 mm$^2$ but no greater than 6 mm$^2$.
(8) The pellicle frame according to any one of (1) to (7), wherein the pellicle frame bar is formed from a material having a Young's modulus of 1 to 80 GPa.
(9) The pellicle frame according to any one of (1) to (8), wherein the pellicle frame bar is formed from a material selected from the group consisting of aluminum, an aluminum alloy, a magnesium alloy, and a polycarbonate resin.
(10) The pellicle frame according to any one of (1) to (9), wherein the pellicle frame bar is formed from an aluminum alloy.
(11) The pellicle frame according to any one of Claims 1 to 10, wherein the pellicle frame has a flatness of at least 0 μm but no greater than 20 μm.
(12) A lithographic pellicle comprising a pellicle film stretched over one end face of the pellicle frame according to any one of Claims 1 to 11 via a pellicle film adhesive, and comprising an exposure master plate adhesive on the other end face.

EXPLANATION OF REFERENCE
NUMERALS AND SYMBOLS

| | |
|---|---|
| 1: | Pellicle film |
| 2: | Adhesion layer |
| 3: | Pellicle frame |
| 4: | Pressure-sensitive adhesion layer |
| 5: | Exposure master plate |
| 10: | Pellicle |
| 12: | Upper edge |
| 13: | Upper end part |
| 14: | Lower edge |
| 15: | Lower end part |
| 16: | Middle part |
| 17: | Side edge |
| 18: | Quadrilateral recess |
| 19: | Side edge |

DETAILED DESCRIPTION OF THE INVENTION

Figure 1:
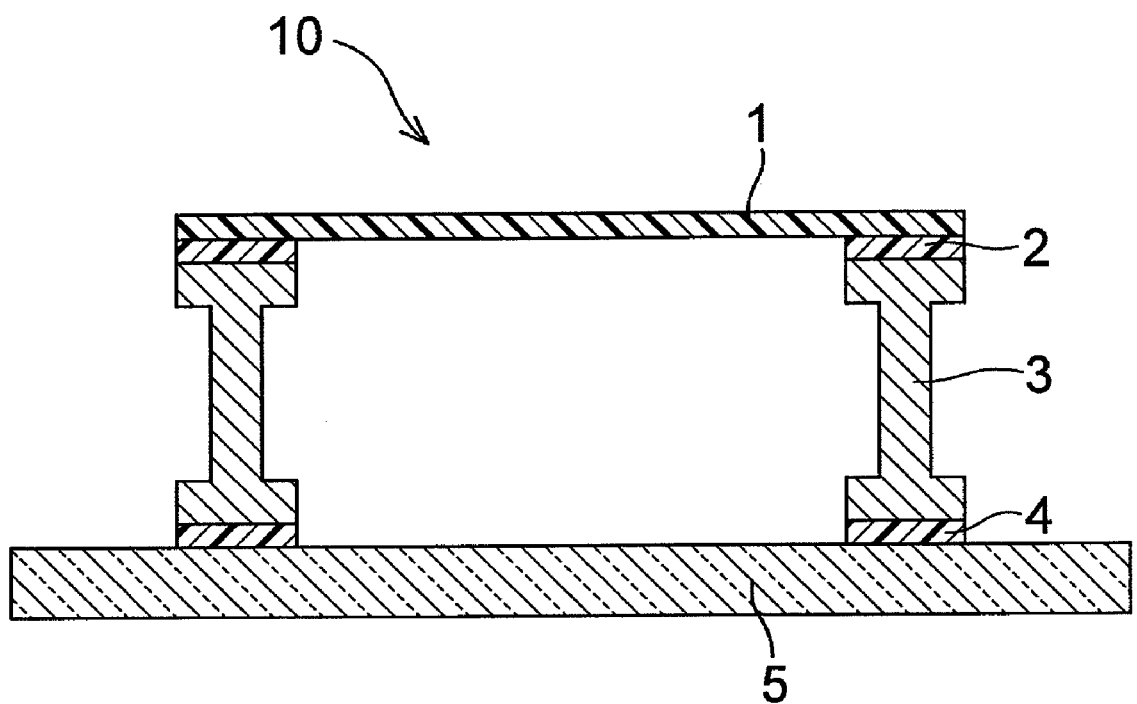
FIG. 1 is an example of a schematic cross-sectional diagram showing a constitutional example of a pellicle.

As shown in FIG. 1, a lithographic pellicle 10 of the present invention is formed by stretching a pellicle film 1 over an upper end face of a pellicle frame 3 via an adhesion layer 2 for affixing the pellicle film. In this case, a pressure-sensitive adhesion layer 4 for adhering the lithographic pellicle 10 to an exposure master plate (mask or reticle) 5 is usually formed on a lower end face of the pellicle frame 3, and a liner (not illustrated) is detachably adhered to a lower end face of the pressure-sensitive adhesion layer 4. The pellicle frame 3 may be provided with an atmospheric pressure adjustment hole (vent) (not illustrated) and, furthermore, this vent may be provided with a dust filter (not illustrated) for the purpose of removing particles.

The pellicle frame may be provided with a jig hole. The shape of the jig hole in the depth direction is not specified, and may be a recess having a taper at the extremity of a column as long as it does not pass completely through.

With regard to the cross-sectional shape of the position where the atmospheric pressure adjustment hole is provided, the outside face to which an atmospheric pressure adjustment filter is affixed is preferably a flat plane, but the inside only may have a recess. Furthermore, the cross-sectional shape of the position where the jig hole is provided preferably remains a basic quadrilateral without a recess, and is more preferably a rectangle.

Figure 2:
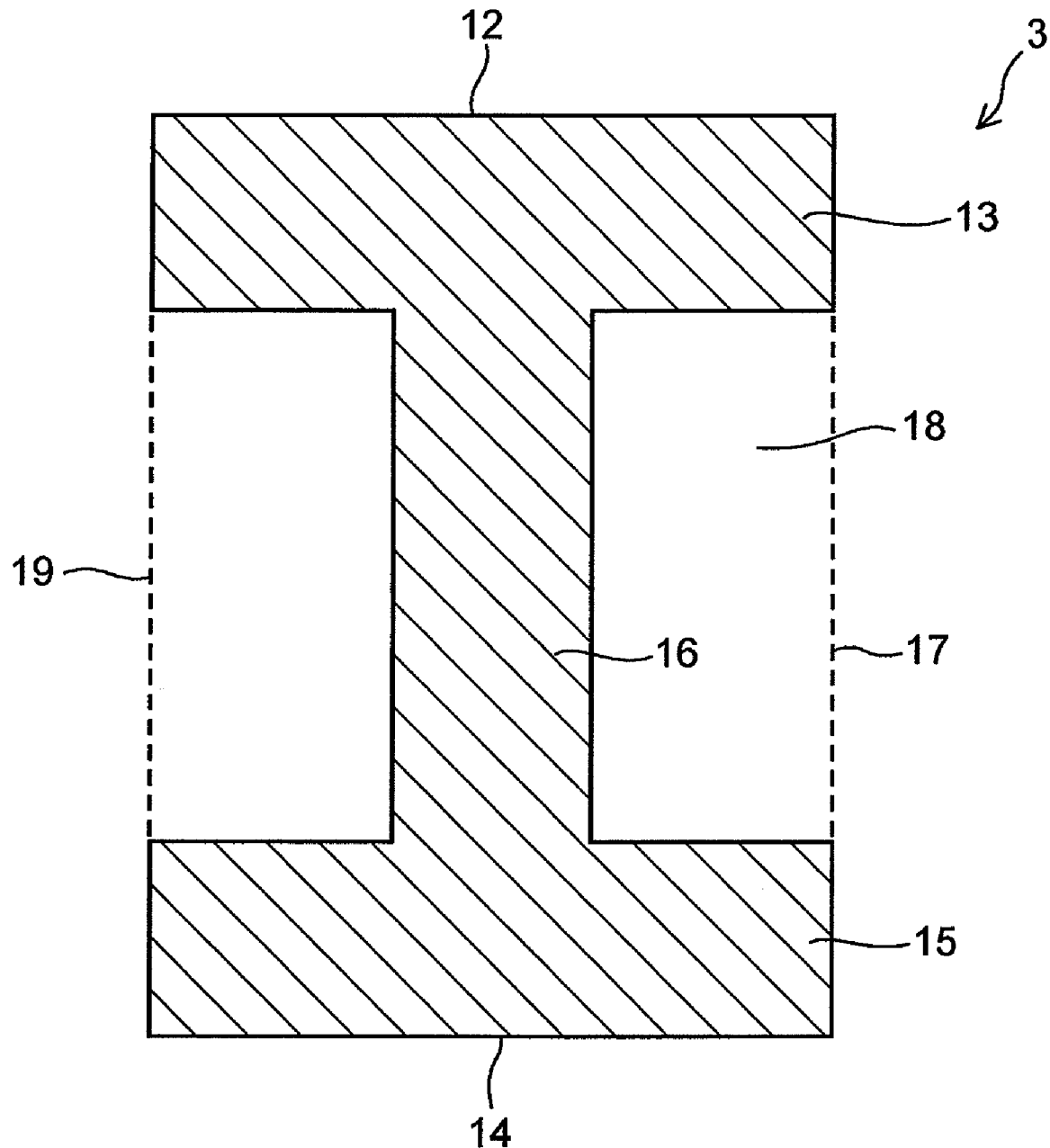
FIG. 2 is a diagram showing one example of the cross-sectional shape of a pellicle frame bar.

As shown in FIG. 2, with regard to the pellicle frame 3 of the present invention, the pellicle frame 3 comprises a pellicle frame bar having a quadrilateral cross-section, wherein an upper edge 12 and a lower edge 14 of a basic quadrilateral forming said cross-section are parallel to each other and each of side edges 17 and 19 of the basic quadrilateral has one quadrilateral recess 18 (hereinafter, also called a 'basic quadrilateral'; formed from the four edges 12, 17, 14, and 19). In other words, the cross-section of the pellicle frame bar has a shape in which an upper end part 13 containing an upper edge 12 and a lower end part 15 containing a lower edge 14 are connected by a middle part 16.

As hereinbefore described, it is thought that distortion of a mask caused by affixing a pellicle to the mask is mainly due to distortion of the pellicle frame of the pellicle. When affixing, the pellicle frame is deformed, and deformation stress caused by it returning to its original shape makes the mask deform. This deformation stress depends on the Young's modulus and the amount of deformation of the material constituting the pellicle frame. In accordance with the present invention, it becomes possible by reducing the cross-sectional area of the pellicle frame bar to less than that of the basic quadrilateral to provide a pellicle frame for which the deformation stress when affixing the pellicle to a mask is small. Conventionally, since a pellicle film is stretched over an upper edge of the pellicle frame and the mask is adhered to the lower edge by providing a pressure-sensitive adhesive, it is necessary for the upper edge and the lower edge to have a certain degree of width. Therefore, the conventional pellicle frame having a rectangular cross-section has large deformation stress. However, in accordance with the present invention, a middle part connecting an upper end part and a lower end part can be made to have a narrower width than both the upper and lower edges by providing recesses in opposite side faces.

Such a pellicle frame bar may be produced by providing quadrilateral recesses in opposite side edges of a basic quadrilateral cross-section. As described above, the outside face of the position where the atmospheric pressure adjustment hole is provided and the opposite side faces of the position where the jig hole is provided are preferably free from recesses and are provided with a predetermined through hole or non-through jig hole.

As disclosed in JP-A-2009-25562, by making the cross-sectional area as small as 6 mm$^2$ or less, the pellicle frame can easily be deformed without changing the material. In order to reduce the cross-sectional area of the pellicle frame bar while maintaining the shape of the basic quadrilateral, it is necessary to either narrow both upper and lower edges or lower the height. However, because of the above-mentioned reasons, the upper edge and the lower edge need to have a certain degree of width. On the other hand, if the height is made too low, the distance between the pellicle film and the mask pattern face becomes small, the defocusing performance of the pellicle is degraded, and the possibility of foreign matter attached to the top of the pellicle film being taken on by a replicated pattern increases. Furthermore, when the height of the pellicle frame is lowered, the problem of handing the pellicle frame being difficult becomes apparent. In this way, making the cross-sectional area small while maintaining the shape of the basic quadrilateral is accompanied by various difficulties.

However, in accordance with the present invention, by providing quadrilateral recesses in opposite side edges of a pellicle frame bar having a cross-section with a basic quadrilateral shape, it becomes possible to reduce the cross-sectional area of the pellicle frame bar compared with the basic quadrilateral, while maintaining the width of both upper and lower edges and the height of the pellicle frame.

The upper edge and the lower edge of the basic quadrilateral are parallel to each other. The basic quadrilateral includes a rectangle, including a square, a trapezoid, and a parallelogram, and among them a rectangle is preferable. With regard to a trapezoid, the upper edge may be shorter or longer than the lower edge.

In the pellicle frame of the present invention, the upper end part and the lower end part preferably have a constant thickness throughout the width.

Furthermore, the cross-section of the pellicle frame bar has quadrilateral recesses in opposite side edges of a basic quadrilateral and does not include a U-shape, which has a quadrilateral recess in only one side edge of a basic quadrilateral.

In the present invention, the pellicle frame bar preferably has a cross-sectional shape having rectangular recesses in opposite side edges of a vertically long rectangle. In other words, the cross-sectional shape is preferably an I-shape in which an upper end part and a lower end part are vertically connected by a middle part having a narrower width than the upper edge and the lower edge.

The present invention is explained below by reference to FIG. 3.

The shape of (a) is one example of the cross-section of the pellicle frame bar in which the basic quadrilateral is a rectangle, and at least one of the recesses is a rectangle having an edge parallel to the above upper edge. It is preferable that both of the recesses are rectangles. This case is one example of the above-mentioned I-shape in which the upper end part 13 and the lower end part 15, which have a constant thickness throughout the width, are connected at substantially the midpoints thereof by the middle part 16, which has a constant width.

The shape of (b) is different from the shape of (a) in terms of the middle part 16 being displaced toward the direction of one end from the midpoints of the upper edge and the lower edge.

The shape of (c) is one example in which the basic quadrilateral is a rectangle, and at least one of the recesses is a trapezoid having an upper edge parallel to the above upper edge of the basic quadrilateral. It is preferable that both of the recesses are trapezoids. This case is different from (a) and (b) in terms of the middle part not being perpendicular to the upper end part and the lower end part but being angled.

The shape of (d) is one example in which the basic quadrilateral is a rectangle, and at least one of the recesses is a trapezoid having an upper edge and a lower edge of the trapezoid perpendicular to the above upper edge of the basic quadrilateral. It is preferable that both the recesses are trapezoids having an upper edge and lower edge of the trapezoid perpendicular to the above upper edge of the basic quadrilateral. In this case, as shown in (d), it is a shape in which the upper end part and the lower end part are connected by the middle part, and the upper end part and the lower end part are thicker in areas closer to the midpoints thereof.

The shape of (e) is one example in which the basic quadrilateral is a trapezoid, and at least one of the recesses is a trapezoid having an upper edge parallel to the above upper edge of the basic quadrilateral. It is preferable that both the recesses are trapezoids having an upper edge parallel to the above upper edge of the basic quadrilateral. This case is a shape in which the upper end part and the lower end part are connected by the middle part. Before or after forming the recess, the sides of the upper end part and lower end part may be machined so as to be perpendicular to the upper edge and lower edge, as shown in FIG. 3 (e).

It is also possible to similarly make the cross-section of the pellicle frame bar have a shape in which the basic quadrilateral is a parallelogram, and opposite side edges thereof have a quadrilateral recess.

The middle part preferably has a constant width, but may have a wider width closer to the upper end part or the lower end part.

The pellicle frame of the present invention is designed as to be appropriate according to the shape of the mask; the plan (top view) shape of the pellicle frame is usually a ring shape, a rectangular shape, or a square shape, and it has a size and a shape that covers a circuit pattern part provided on the mask. A corner of a pellicle frame having a rectangular shape (including a square) may be chamfered with a curved face or one or more flat faces.

The height of the pellicle frame is preferably about 1 to 10 mm, more preferably about 2 to 7 mm, and particularly preferably about 3 to 6 mm. The width of the upper edge and the lower edge of the pellicle frame is preferably 1 to 3 mm, and a width of about 2 mm is preferable in terms of general purpose features.

The thickness of the upper end part and the lower end part is preferably at least 0.1 mm, more preferably 0.3 to 0.8 mm.

The area of the basic quadrilateral of the pellicle frame of the present invention is preferably no greater than 20 mm$^2$, more preferably 4 to 20 mm$^2$.

The cross-sectional area of the pellicle frame bar in the present invention is preferably no greater than 6 mm$^2$, more preferably 1 to 6 mm$^2$. By narrowing the width of the middle part of the pellicle frame as in the present invention, a small cross-sectional area can easily be achieved. By reducing the cross-sectional area in this way, deformation stress can be reduced, and as a result deformation of the mask can also be reduced.

As a material constituting the pellicle frame, a material having a Young's modulus of 1 to 80 GPa is preferable, and preferred examples thereof include aluminum, a magnesium alloy, and a synthetic resin; aluminum, a magnesium alloy, or a polycarbonate resin is more suitably used, and aluminum is more preferably used.

As the aluminum, a conventionally used aluminum alloy material may be preferably used, and a JIS A7075, JIS A6061, JIS A5052 material, etc. may be more preferably used, but it is not particularly limited as long as it has the above-mentioned cross-sectional shape and the strength as a pellicle frame can be ensured.

The surface of the pellicle frame is preferably roughened by sandblasting or chemical abrasion prior to carrying out a surface treatment such as coating with a polymer. In the present invention, the method for roughening the surface of the frame may employ a conventionally known method. It is preferable to employ a method for roughening the surface involving blasting the aluminum alloy material surface with stainless steel, carborundum, glass beads, etc., and further by chemically abrading with NaOH, etc.

The pellicle frame of the present invention may preferably be constituted from a material having a Young's modulus of 1 to 50 GPa instead of using a material having a high Young's modulus such as a conventionally commonly used aluminum alloy material of 69 GPa. As a material having a Young's modulus in the above range, a magnesium alloy of 44 GPa, an acrylic resin of 3 GPa, and a polycarbonate resin of 2.5 GPa can be cited as examples.

When such a material having a low Young's modulus is used, even if the cross-sectional area exceeds 6 $mm^2$, for example the I-shape cross-sectional area is 12 $mm^2$, deformation stress of the pellicle frame can be reduced, and deformation of the mask can be suppressed.

When the cross-sectional shape of a pellicle frame is a I-shape and its cross-sectional area is 3 to 6 $mm^2$, due to a synergistic effect the lower the Young's modulus of the material used, the more the deformation of the mask is suppressed.

In the present invention, it is preferable to C-chamfer a corner in the exposure master plate adhesion face and/or the pellicle film adhesion face of the pellicle frame between the inside and outside faces of the pellicle frame and the exposure master plate adhesion face and/or pellicle film adhesion face. C-chamfering means cutting an intersecting planes portion, that is, a corner, at 45°.

The average pellicle frame flatness is on the order of about 20 to 80 μm. In the present invention, the flatness of the pellicle frame is preferably at least 0 μm but no greater than 20 μm, and more preferably at least 0 μm but no greater than 10 μm.

When the flatness of the pellicle frame is good, the amount of deformation of the pellicle frame when affixing the pellicle to the mask can be reduced, and as a result the deformation stress imposed on the pellicle frame can be reduced, and the amount of deformation of the mask can be reduced.

The 'flatness' of the pellicle frame is a value obtained by measuring the height of 8 points at positions appropriately separated from each other on the pellicle frame, preferably a total of 8 points, that is, 1 point at each corner of the pellicle frame and 1 point in the middle of each of the 4 edges, calculating an imaginary plane, and subtracting the minimum point from the maximum point with respect to the distance of each point from the imaginary plane.

The flatness of the pellicle frame may be measured by a 'laser displacement meter having an XY axis program stage', and in the present invention an above-mentioned displacement meter was used.

Mask flatness was measured using an UltraFlat (Tropel).

Furthermore, the maximum deformation range of the mask caused by affixing a pellicle to the mask was used as an index for mask deformation/distortion. Definitions of mask flatness and maximum deformation range and measurement methods therefor are described in the Examples.

In the present invention, in order to absorb stray light, the pellicle frame preferably has a black oxide coating and/or a black polymer coating. Furthermore, when the pellicle frame is made of an aluminum alloy, the pellicle frame made from an aluminum alloy having a black anodized coating (a black almite coating) and/or a polymer electrodeposition-coated film is particularly preferable.

As a method for forming a black anodized coating on the pellicle frame surface, in general, after treating in a treatment bath of an alkali such as NaOH for a few tens of seconds, anodization is carried out in a dilute sulfuric acid aqueous solution, subsequently black staining and sealing treatments are carried out, and a black oxidized coating may thus be provided on the surface.

Furthermore, the polymer coating may be provided by various methods, and in general spray coating, electrostatic coating, electrodeposition coating, etc. can be cited as examples. In the present invention, it is preferable to provide the polymer coating by electrodeposition coating.

With regard to the electrodeposition coating, either a thermosetting resin or a UV curing resin may be used. It is also possible to employ either anionic electrodeposition coating or cationic electrodeposition coating for the resins. In the present invention, since UV resistance is also required, it is preferable to employ anionic electrodeposition coating of a thermosetting resin in terms of coating stability, appearance, and strength.

The lithographic pellicle of the present invention may be produced by stretching a pellicle film over one end face, that is, the upper edge, of any of the above-mentioned pellicle frames via a pellicle film adhesive, and providing an exposure master plate adhesive on the other end face, that is, the lower edge.

The type of pellicle film is not particularly limited and, for example, an amorphous fluorine polymer, etc. that has conventionally been used for an excimer laser may be used. Examples of the amorphous fluorine polymer include Cytop (product name, manufactured by Asahi Glass Co., Ltd.) and Teflon (Registered Trademark) AF (product name, manufactured by DuPont). These polymers may be used by dissolving them in a solvent as necessary when preparing the pellicle film, and may be dissolved as appropriate in, for example, a fluorine-based solvent.

In accordance with the present invention, there can be provided a pellicle frame and a lithographic pellicle that can suppress deformation of an exposure master plate due to deformation of a pellicle frame.

EXAMPLES

The present invention is explained below more specifically by reference to Examples. A 'mask' in the Examples and Comparative Example is illustrated as an example of the 'exposure master plate' and, needless to say, application to a reticle can be carried out in the same manner.

The present invention is specifically explained below by way of Examples, but the present invention is not limited only to the Examples below.

Example 1

A 5% solution of Cytop CTX-S (product name, manufactured by Asahi Glass Co., Ltd.) dissolved in perfluorotributylamine was dropped on a silicon wafer and spread over the wafer by rotating the wafer at 830 rpm by a spin coating method. Subsequently, drying was carried out at room temperature (25° C.) for 30 minutes and then at 180° C., thus giving a uniform film. An aluminum framework coated with an adhesive was affixed thereto, and only the film was peeled off, thus giving a pellicle film. The required number of Cytop CTX-S films were prepared and used in Examples 1 to 10 and the Comparative Example.

Figure 3:
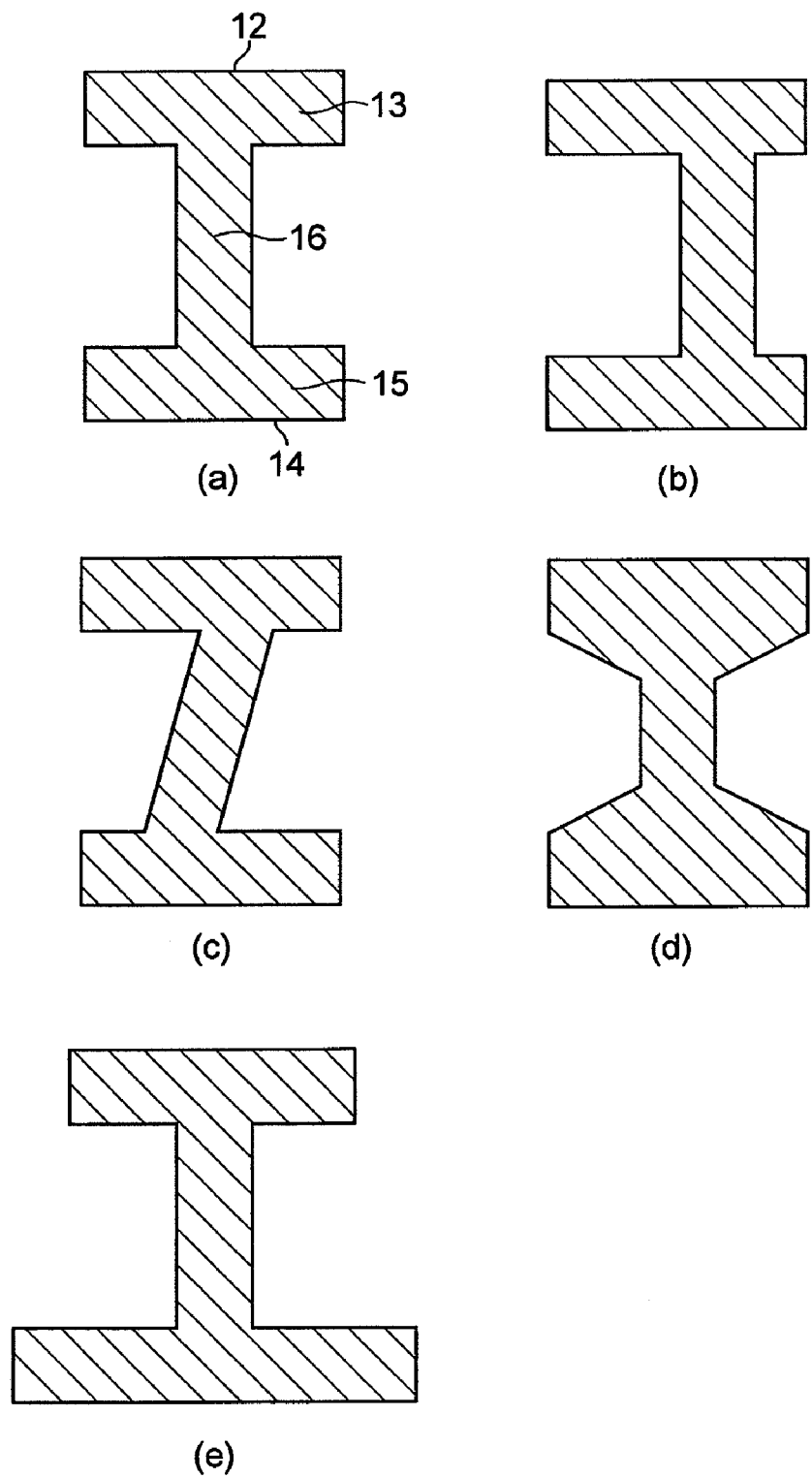
FIG. 3 is a diagram showing a modified example of the cross-sectional shape of the pellicle frame bar.

A pellicle frame with outer dimensions of 149 mm×122 mm×3.5 mm and a width of the upper edge and lower edge of 2 mm was prepared from an aluminum alloy (also called an 'Al alloy') (the cross-sectional shape being shown in FIG. 3 (a), and the cross-sectional area being 3.25 mm$^2$). The cross-sectional shape was an I-shape obtained by removing rectangles having a height of 2.5 mm and a width of 0.75 mm from central parts of opposite side faces of a rectangle having a height of 3.5 mm and a width of 2.0 mm. The thickness of the upper end part and lower end part was 0.5 mm, and the width of the middle part was also 0.5 mm. Four corners of the pellicle frame were subjected to C-chamfering.

When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.26 μm. Although the maximum deformation range changed by 40 nm, compared with the Comparative Example, it could be suppressed to a very low value. The results of measurement of flatness and maximum deformation range are summarized in Table 1.

Mask flatness was measured using an UltraFlat (Tropel). Frame flatness was measured using a laser displacement meter having an XY axis program stage.

Furthermore, the 'maximum deformation range of the mask' is defined as the sum of the absolute values of the maximum change on +/− sides for the difference in height of each point of the mask when the profile of the mask is measured twice. When the mask is deformed due to affixing the pellicle, since the maximum deformation range becomes a large value even if the flatness does not change, the maximum deformation range is more effective as an index for mask deformation/distortion than flatness.

Example 2

A pellicle frame with outer dimensions of 149 mm×115 mm×3.0 mm and a width of the upper edge and lower edge of 2 mm was prepared from an aluminum alloy (the cross-sectional shape being shown in FIG. 3 (a), and the cross-sectional area being 3.00 mm$^2$). When the flatness of this frame was measured from the side that was to be coated with a mask pressure-sensitive adhesive, it was found to be 10 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.24 μm. Although the maximum deformation range changed by 30 nm, compared with the Comparative Example, it could be suppressed to a very low value. The results of measurement of flatness and maximum deformation range are summarized in Table 1.

Example 3

A pellicle frame with outer dimensions of 149 mm×122 mm×3.5 mm and a width of the upper edge and lower edge of 2 mm was prepared from a magnesium alloy (also called an 'Mg alloy') (the cross-sectional shape being shown in FIG. 3 (a), and the cross-sectional area being 3.25 mm$^2$). When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the magnesium alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.24 μm. Although the maximum deformation range changed by 28 nm, compared with the Comparative Example, it could be suppressed to a very low value. The results of measurement of flatness and maximum deformation range are summarized in Table 1.

Example 4

A pellicle frame with outer dimensions of 149 mm×122 mm×3.5 mm and a width of the upper edge and lower edge of 2 mm was prepared from a polycarbonate resin (also called a 'PC resin') (the cross-sectional shape being shown in FIG. 3 (a), and the cross-sectional area being 3.25 mm$^2$). When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the polycarbonate resin frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.25 μm. Although the maximum deformation range changed by 20 nm, compared with the Comparative Example, it could be suppressed to a very low value. The results of measurement of flatness and maximum deformation range are summarized in Table 1.

Example 5

A pellicle frame with outer dimensions of 149 mm×115 mm×4.5 mm and a width of the upper edge and lower edge of 2 mm was prepared from an aluminum alloy (the cross-sectional shape being shown in FIG. 3 (a), and the cross-sectional area being 3.75 mm$^2$). When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.27 μm. Although the maximum deformation range changed by 50 nm, compared with the Comparative Example, it could be suppressed to a very low value. The results of measurement of flatness and maximum deformation range are summarized in Table 1.

Example 6

A pellicle frame with outer dimensions of 149 mm×122 mm×3.5 mm and a width of the upper edge and lower edge of 2 mm was prepared from an aluminum alloy (the cross-sectional shape being shown in FIG. 3 (b), and the cross-sectional area being 3.25 mm$^2$). The outside face of this frame was cut to a depth of 1 mm, and the inside face was cut to a depth of 0.5 mm. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.24 μm. Although the maximum deformation range changed by 40 nm, compared with the Comparative Example, it could be suppressed to a very low value. The results of measurement of flatness and maximum deformation range are summarized in Table 1.

Example 7

A pellicle frame with outer dimensions of 149 mm×122 mm×3.5 mm and a width of the upper edge and lower edge of 2 mm was prepared from an aluminum alloy (the cross-sectional shape being shown in FIG. 3 (c), and the cross-sectional area being 3.25 mm$^2$). A trapezoidal shape having an upper edge of 1 mm, a lower edge of 0.5 mm, and a height of 2.5 mm was cut from the outside face of this frame, and a trapezoidal shape having an upper edge of 0.5 mm, a lower edge of 1.0 mm, and a height of 2.5 mm was cut from the inside thereof. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.25 μm. Although the maximum deformation range changed by 35 nm, compared with the Comparative Example, it could be suppressed to a very low value. The results of measurement of flatness and maximum deformation range are summarized in Table 1.

Example 8

A pellicle frame with outer dimensions of 149 mm×122 mm×3.5 mm and a width of the upper edge and lower edge of 2 mm was prepared from an aluminum alloy (the cross-sectional shape being shown in FIG. 3 (d), and the cross-sectional area being 4.00 mm$^2$). Machining was carried out from both inside and outside faces, and a middle part connecting the upper end part and the lower end part had a width of 0.5 mm and a height of 1.5 mm. When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.27 μm. Although the maximum deformation range changed by 45 nm, compared with the Comparative Example, it could be suppressed to a very low value. The results of measurement of flatness and maximum deformation range are summarized in Table 1.

Example 9

A pellicle frame with outer dimensions of 149 mm×122 mm×3.5 mm and a width of the upper edge and lower edge of 2 mm was prepared from a polycarbonate resin (the cross-sectional shape being shown in FIG. 3 (d), and the cross-sectional area being 4.00 mm$^2$). When the flatness of this frame was measured from the side that was to be coated with a mask pressure-sensitive adhesive, it was found to be 20 μm. One end face of the frame was coated with the mask pressure-sensitive adhesive, and the other end face was coated with a film adhesive. Subsequently, the pellicle film previously peeled off was affixed to the film adhesive side of the polycarbonate resin frame and the film on the outer periphery of the frame was cut, thus completing a pellicle.

The pellicle thus completed was affixed to a 142 mm square mask with a flatness of 0.25 μm using a load of 20 kg. Subsequently, when the flatness of the pellicle-equipped mask was measured again, it was found to be 0.25 μm. Although the maximum deformation range changed by 25 nm, compared with the Comparative Example, it could be suppressed to a very low value. The results of measurement of flatness and maximum deformation range are summarized in Table 1.

Example 10

A pellicle frame with outer dimensions of 149 mm×122 mm×3.5 mm and a width of the upper edge of 1.5 mm and a width of the lower edge of 2.5 mm was prepared from an aluminum alloy (the cross-sectional shape being shown in FIG. 3 (e), and the cross-sectional area being 3.25 mm$^2$). The upper edge was 1.5 mm, the lower edge was 2.5 mm, and the middle part connecting the upper end part and the lower end part had a width of 0.5 mm and a height of 2.5 mm. Furthermore, the thickness of the upper end part and the lower end part was 0.5 mm. When the flatness of this frame was measured from the side that was to be coated with a mask pressure-sensitive adhesive, it was found to be 20 µm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 µm using a load of 20 kg. Subsequently, when the flatness of the pellicle-equipped mask was measured again, it was found to be 0.26 µm. Although the maximum deformation range changed by 40 nm, compared with the Comparative Example, it could be suppressed to a very low value. The results of measurement of flatness and maximum deformation range are summarized in Table 1.

Comparative Example

A pellicle frame with outer dimensions of 149 mm×122 mm×3.5 mm and a width of the upper edge and lower edge of 2 mm was prepared from an aluminum alloy (the cross-sectional shape being a rectangular, and the cross-sectional area being 7 mm$^2$). When the flatness of this frame was measured from the side that was to be coated with a mask pressure-sensitive adhesive, it was found to be 20 µm. One end face of the frame was coated with the mask pressure-sensitive adhesive, and the other end face was coated with a film adhesive. Subsequently, the pellicle film previously peeled off was affixed to the film adhesive side of the aluminum alloy frame and the film on the outer periphery of the frame was cut, thus completing a pellicle.

The pellicle thus completed was affixed to a 142 mm square mask with a flatness of 0.25 µm using a load of 20 kg. Subsequently, when the flatness of the pellicle-equipped mask was measured again, it changed to 0.29 µm. Furthermore, the maximum deformation range was changed greatly to 100 nm.

The results above are all as shown in Table 1 below.

The invention claimed is:

1. A pellicle frame comprising a pellicle frame bar having a quadrilateral cross-section, wherein an upper edge and a lower edge of a basic quadrilateral forming said cross-section are parallel to each other and each of side edges of the basic quadrilateral has one quadrilateral recess.

2. The pellicle frame according to claim 1, wherein the basic quadrilateral is a rectangle, and at least one of the recesses is a rectangle having an edge parallel to the upper edge of the basic quadrilateral.

3. The pellicle frame according to claim 1, wherein the basic quadrilateral is a rectangle, and at least one of the recesses is a trapezoid having an upper edge parallel to the upper edge of the basic quadrilateral.

4. The pellicle frame according to claim 1, wherein the basic quadrilateral is a rectangle, and at least one of the recesses is a trapezoid having an upper edge and a lower edge of the trapezoid perpendicular to the upper edge of the basic quadrilateral.

5. The pellicle frame according to claim 1, wherein the basic quadrilateral is a trapezoid, and at least one of the recesses is a trapezoid having an upper edge parallel to the upper edge of the basic quadrilateral.

6. The pellicle frame according to claim 1, wherein the basic quadrilateral has a cross-sectional area of at least 4 mm$^2$ but no greater than 20 mm$^2$.

7. The pellicle frame according to claim 1, wherein the pellicle frame bar has a cross-sectional area of at least 1 mm$^2$ but no greater than 6 mm$^2$.

8. The pellicle frame according to claim 1, wherein the pellicle frame bar is formed from a material having a Young's modulus of 1 to 80 GPa.

9. The pellicle frame according to claim 1, wherein the pellicle frame bar is formed from a material selected from the group consisting of aluminum, an aluminum alloy, a magnesium alloy, and a polycarbonate resin.

10. The pellicle frame according to claim 1, wherein the pellicle frame bar is formed from an aluminum alloy.

TABLE 1

| | Pellicle Frame | | | | | | Measurement value | | |
| --- | --- | --- | --- | --- | --- | --- | --- | --- | --- |
| | | | | | | | | Mask flatness | | Maximum |
| Examples and Comp. Ex. | Cross-sectional shape in FIG. 3 | Width of upper and lower edges (mm) | Height (mm) | Cross-sectional area (mm$^2$) | Material | Young's Modulus (GPa) | Frame flatness (µm) | Before affixing (µm) | After affixing (µm) | deformation range (nm) |
| Example 1 | a | 2.0/2.0 | 3.5 | 3.25 | Al alloy | 69 | 20 | 0.25 | 0.26 | 40 |
| Example 2 | a | 2.0/2.0 | 3.0 | 3.00 | Al alloy | 69 | 10 | 0.25 | 0.24 | 30 |
| Example 3 | a | 2.0/2.0 | 3.5 | 3.25 | Mg alloy | 44 | 20 | 0.25 | 0.24 | 28 |
| Example 4 | a | 2.0/2.0 | 3.5 | 3.25 | PC resin | 2.5 | 20 | 0.25 | 0.25 | 20 |
| Example 5 | a | 2.0/2.0 | 4.5 | 3.75 | Al alloy | 69 | 20 | 0.25 | 0.27 | 50 |
| Example 6 | b | 2.0/2.0 | 3.5 | 3.25 | Al alloy | 69 | 10 | 0.25 | 0.24 | 40 |
| Example 7 | c | 2.0/2.0 | 3.5 | 3.25 | Al alloy | 69 | 20 | 0.25 | 0.25 | 35 |
| Example 8 | d | 2.0/2.0 | 3.5 | 4.00 | Al alloy | 69 | 20 | 0.25 | 0.27 | 45 |
| Example 9 | d | 2.0/2.0 | 3.5 | 4.00 | PC resin | 2.5 | 20 | 0.25 | 0.25 | 25 |
| Example 10 | e | 1.5/2.5 | 3.5 | 3.25 | Al alloy | 69 | 20 | 0.25 | 0.26 | 40 |
| Comp. Ex. | Rectangle | 2.0/2.0 | 3.5 | 7.00 | Al alloy | 69 | 20 | 0.25 | 0.29 | 100 |

Al alloy: an aluminum alloy
Mg alloy: a magnesium alloy
PC resin: a polycarbonate resin 11. The pellicle frame according to claim 1, wherein the pellicle frame has a flatness of at least 0 μm but no greater than 20 μm.

12. A lithographic pellicle comprising a pellicle film stretched over one end face of the pellicle frame according to claim 1 via a pellicle film adhesive, and comprising an exposure master plate adhesive on the other end face.

* * * * *